United States Patent
Knickerbocker (10) Patent No.: US 8,344,512 B2
(45) Date of Patent: Jan. 1, 2013

(54) THREE-DIMENSIONAL SILICON INTERPOSER FOR LOW VOLTAGE LOW POWER SYSTEMS

(75) Inventor: John U. Knickerbocker, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 792 days.

(21) Appl. No.: 12/544,987

(22) Filed: Aug. 20, 2009

(65) Prior Publication Data

US 2011/0042795 A1   Feb. 24, 2011

(51) Int. Cl.
*H01L 23/535* (2006.01)
(52) U.S. Cl. ............... 257/773; 257/774; 257/E21.585; 438/637
(58) Field of Classification Search ............. 257/773, 257/774, E21.585, E23.011, E23.168, 786; 438/637
See application file for complete search history.

(56) References Cited

U.S. PATENT DOCUMENTS

| | | | |
|---|---|---|---|
| 6,521,530 B2 | 2/2003 | Peters et al. |
| 6,528,892 B2 | 3/2003 | Caletka et al. |
| 6,703,704 B1 | 3/2004 | Alcoe et al. |
| 6,875,638 B2 | 4/2005 | Yoneda et al. |
| 6,995,044 B2 | 2/2006 | Yoneda et al. |
| 7,034,401 B2 | 4/2006 | Savastiouk et al. |
| 7,186,586 B2 | 3/2007 | Savastiouk et al. |
| 7,189,595 B2 | 3/2007 | Magerlein et al. |
| 7,213,330 B2 | 5/2007 | Caldwell et al. |
| 7,225,538 B2 | 6/2007 | Eldridge et al. |
| 7,241,641 B2 | 7/2007 | Savastiouk et al. |
| 7,317,256 B2 | 1/2008 | Williams et al. |
| 2002/0180013 A1 | 12/2002 | Brofman et al. |
| 2005/0189636 A1 | 9/2005 | Savastiouk et al. |
| 2008/0032457 A1 | 2/2008 | McWilliams et al. |
| 2008/0079150 A1 | 4/2008 | Simon et al. |

OTHER PUBLICATIONS

Bickford et al., "Enhanced I/O Capability for Silicon on Silicon Using Solder Columns," IBM Technical Disclosure Bulletin, vol. 36, No. 12, pp. 75-76 (Dec. 1993).

*Primary Examiner* — Roy Potter
(74) *Attorney, Agent, or Firm* — Vazken Alexanian; Michael J. Chang, LLC (57) ABSTRACT

Scalable silicon (Si) interposer configurations that support low voltage, low power operations are provided. In one aspect, a Si interposer is provided which includes a plurality of through-silicon vias (TSVs) within a first plane thereof adapted to serve as power, ground and signal interconnections throughout the first plane such that the TSVs that serve as the power and ground interconnections are greater in number and/or size than the TSVs that serve as the signal interconnections; and a plurality of lines within a second plane of the interposer in contact with one or more of the TSVs in the first plane, the second plane being adjacent to the first plane, adapted to serve as power, ground and signal interconnections throughout the second plane such that the lines that serve as the power and the ground interconnections are greater in number and/or size than the lines that serve as the signal interconnections.

22 Claims, 8 Drawing Sheets

THREE-DIMENSIONAL SILICON INTERPOSER FOR LOW VOLTAGE LOW POWER SYSTEMS

STATEMENT OF GOVERNMENT RIGHTS

This invention was made with Government support under Contract number H98230-07-C-0409 awarded by National Security Agency. The Government has certain rights in this invention.

FIELD OF THE INVENTION

The present invention relates to interconnect technology, and more particularly, to scalable silicon (Si) interposer configurations that support low voltage, low power operations.

BACKGROUND OF THE INVENTION

The scaling requirements of today's electronic devices present a challenge with regard to providing the proper power, ground, signal and/or various other connections to each component within a device. For example, chips with area array interconnections having a pitch of 200 micrometers (μm), or less, are now common. Interconnect structures having a multitude of line paths therethrough are generally used to connect the chips to a printed wire board. Thus, the lines must also be scalable to accommodate such closely-spaced connections on the chips.

Further, to reduce power consumption, lower power applications are being implemented. For example, in conventional data centers, power consumption levels are based on devices operating at voltages typically of about one volt (V) or higher. In order to drive significant power savings, use of lower voltages for multi-core processors, to support power levels of less than one V, such as less than 500 millivolts (mV), e.g., less than 300 mV, can lead to one half to one third the power consumption for data processing operations as compared to conventional systems.

A combination of aggressive scaling and low power levels can undesirably lead to an increased amount of errors. Namely, as will be described below, scaling can lead to an increase in voltage variations, i.e., voltage droop, across the chips. These variations can, in some instances, be a significant milli-voltage drop (i.e., from about 10 mV to about 50 mV, or greater) even for the (reduced) operating power levels, e.g., 300 mV, if not properly architected and designed. Thus, depending on the severity of the voltage droop, transistors or circuits in a chip, a chip stack or across multiple chips may not receive the proper voltage and not operate properly or operate with errors.

Figure 1:
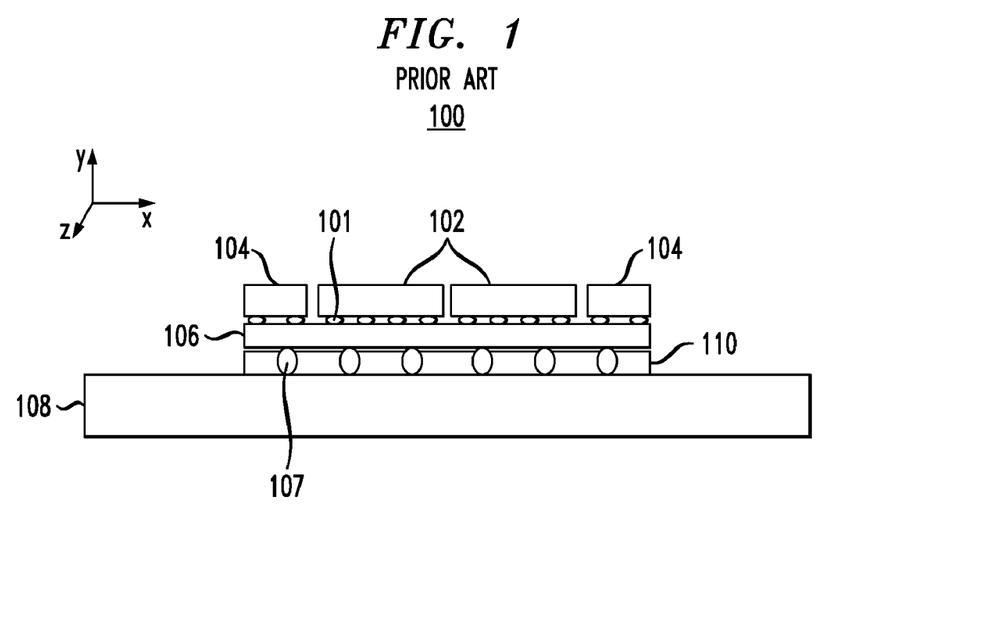
FIG. 1 is a cross-sectional diagram illustrating a conventional chip integration structure.

For example, FIG. 1 is a cross-sectional diagram illustrating conventional chip integration structure 100. Chip integration structure 100 includes chips 102 and decoupling capacitors 104 having one or more (i.e., power, ground and/or signal) connections 101 to substrate 106. Substrate 106 is, for example, a standard ceramic or organic substrate having one or more (i.e., power, ground and/or signal) connections 107 to printed wire board 108. Substrate 106 contains a plurality of lines therethrough (not shown) interconnecting connections 101 to chips 102/decoupling capacitors 104 and connections 107 to printed wire board 108. Package 110 is present between substrate 106 and printed wire board 108.

As is a common practice, the power and ground connections are typically separated from one another by at least one signal connection. Thus, for example, if the connections to substrate 106 are at a 200 μm pitch, then a distance between the power and ground connections is two times the pitch, or 400 μm. This area array input/output (I/O) distancing practice along with typically limited X-Y power and ground cross-sectional size for power grids on a chip, as well as more simultaneous switching transistors drawing power per unit area (as lithographic advancements are made in each new technology node) can limit scalability. Furthermore the evolving drive to miniaturization and performance scaling with through-silicon-vias and thinned die stacking can further magnify the power delivery and voltage droop problem with scaling of each new technology node.

As highlighted above, with scaling, on chip voltage droop becomes a significant factor. Namely, it is difficult to maintain a uniform voltage from the printed wire board through the substrate to the chips when x- and y-line dimensions (see FIG. 1) of the substrate are reduced. As voltage droop gets larger (especially in the context of reduced operating power levels) proper chip operation is at risk and more errors can occur. By way of example only, high level transistor switching can lead to many tens of mV droop in power and a risk of chip malfunction due to a supply voltage of one V. Therefore, the risk for operation at less than 500 mV is even greater. Decoupling capacitors, such as decoupling capacitors 104, can be implemented to accommodate a certain level of voltage fluctuations even with large numbers of simultaneous switching circuits. However, as scaling requirements force feature sizes to get increasingly smaller and the number of circuits per unit area and volume continues to scale with lithographic advancements within one silicon strata level and thinned silicon, and with three-dimensional (3D) stacked chip structures leading to ever more circuits per unit volume, the capabilities of the decoupling capacitors on chip and off chip can be exceeded.

Therefore, chip integration techniques that can accommodate both scaling and reduced power operations without the associated voltage droop problems would be desirable.

SUMMARY OF THE INVENTION

The present invention provides scalable silicon (Si) interposer configurations that support low voltage, low power operations. In one aspect of the invention, a Si interposer is provided. The Si interposer comprises a plurality of through-silicon vias (TSVs) within a first plane of the interposer, wherein the TSVs are adapted to serve as power, ground and signal interconnections throughout the first plane such that the TSVs that serve as the power and ground interconnections are greater in at least one of number and size than the TSVs that serve as the signal interconnections so as to support uniform power distribution during low voltage operations; and a plurality of lines within a second plane of the interposer in contact with one or more of the TSVs in the first plane, the second plane being adjacent to the first plane, wherein the lines are adapted to serve as power, ground and signal interconnections throughout the second plane such that the lines that serve as the power and ground interconnections are greater in at least one of number and size than the lines that serve as the signal interconnections so as to support uniform power distribution during low voltage operations.

In another aspect of the invention, a chip integration structure is provided. The chip integration structure comprises a substrate; at least one Si interposer with one or more power, ground and signal connections to the substrate; and one or more chips, one or more chip stacks or at least one chip in combination with at least one chip stack having one or more power, ground and signal connections to the silicon interposer. The Si interposer comprises a plurality of TSVs within a first plane of the interposer in contact with the one or more power, ground and signal connections to the substrate, wherein the TSVs are adapted to serve as power, ground and signal interconnections throughout the first plane such that the TSVs that serve as the power and ground interconnections are greater in at least one of number and size than the TSVs that serve as the signal interconnections so as to support uniform power distribution during low voltage operations; and a plurality of lines within a second plane of the interposer in contact with one or more of the TSVs in the first plane, the second plane being adjacent to the first plane, wherein the lines are adapted to serve as power, ground and signal interconnections throughout the second plane such that the lines that serve as the power and ground interconnections are greater in at least one of number and size than the lines that serve as the signal interconnections so as to support uniform power distribution during low voltage operations. The one or more power, ground and signal connections of the one or more chips, one or more chip stacks or at least one chip in combination with at least one chip stack to the Si interposer are in contact with one or more of the lines within the second plane of the interposer.

In yet another aspect of the invention, a method of fabricating a Si interposer that supports uniform power distribution during low voltage operations is provided. The method comprises the following steps. A Si wafer is provided. A first plane of the interposer is created by forming a plurality of TSVs in the wafer, wherein the TSVs are adapted to serve as power, ground and signal interconnections throughout the first plane and are formed such that the TSVs that serve as the power and ground interconnections are greater in at least one of number and size than the TSVs that serve as the signal interconnections so as to support uniform power distribution during low voltage operations. An insulator layer is deposited over the Si wafer. A second plane of the interposer is created adjacent to the first plane by forming a plurality of lines within the insulator layer in contact with one or more of the TSVs in the wafer, wherein one or more of the lines are adapted to serve as power, ground and signal interconnections throughout the second plane and are formed such that the lines that serve as the power and ground interconnections are greater in at least one of number and size than the lines that serve as the signal interconnections so as to support uniform power distribution during low voltage operations.

A more complete understanding of the present invention, as well as further features and advantages of the present invention, will be obtained by reference to the following detailed description and drawings.

DETAILED DESCRIPTION OF PREFERRED EMBODIMENTS

Figure 2:
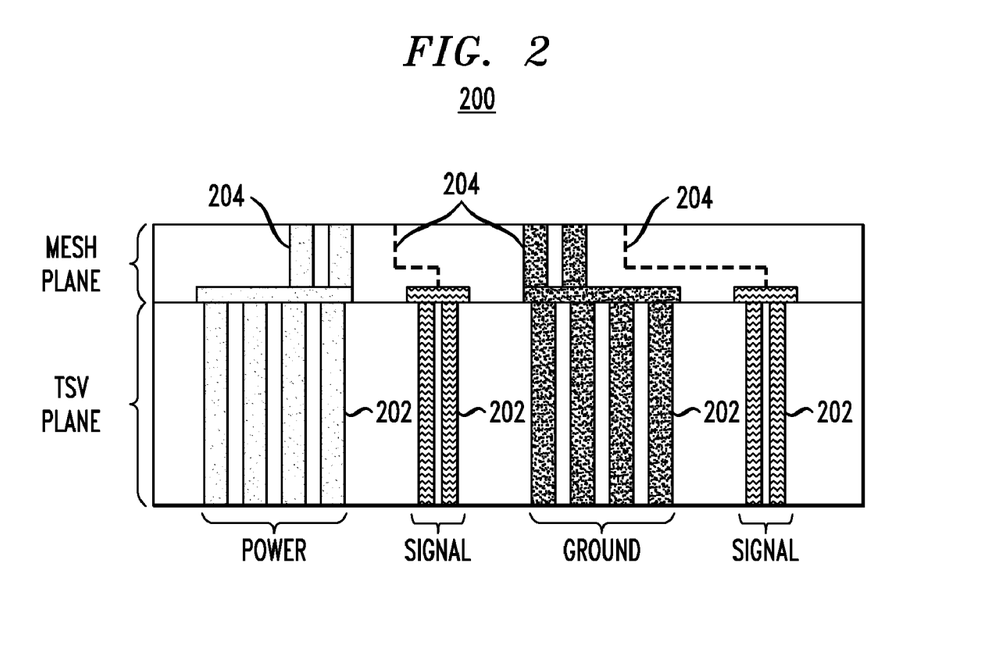
FIG. 2 is a cross-sectional diagram illustrating an exemplary silicon (Si) interposer according to an embodiment of the present invention.

FIG. 2 is a cross-sectional diagram illustrating exemplary silicon (Si) interposer 200. An interposer structure is sometimes also referred to in the semiconductor arts as a platform and/or as a carrier. Often these terms are used interchangeably. For consistency, the term "interposer" is used herein throughout. Si interposer 200 includes through-silicon vias (TSVs) 202 within a first plane thereof (this first plane of Si interposer 200 is also referred to herein as a TSV plane). TSVs 202 serve as power, ground and signal interconnections throughout the TSV plane. One advantage of the present teachings is that Si interposer 200 supports uniform power distribution therethrough even during low voltage operations. According to one exemplary embodiment, in order to support uniform power distribution through Si interposer 200 during low voltage operations (for example, during low voltage operations of less than 500 millivolts (mV), e.g., during low voltage operations of less than 300 mV), the TSVs 202 that serve as the power and ground interconnections are greater in number and/or size (e.g., measured as a diameter of each TSV) than the TSVs 202 that serve as the signal interconnections. See, for example, in FIG. 2 wherein it is shown that the TSVs 202 that serve as the power and ground interconnections are present in a greater number and each having a greater size than the TSVs 202 that serve as the signal interconnections.

Si interposer 200 also includes lines 204 within a second plane thereof (this second plane of Si interposer 200 is also referred to herein as a power, ground and signal mesh plane and as shown in FIG. 2 is adjacent to the TSV plane). Lines 204 are in contact with one or more of TSVs 202 in the TSV plane. Lines 204 serve as power, ground and signal interconnections throughout the mesh plane. According to one exemplary embodiment, in order to support uniform power distribution through Si interposer 200 during low voltage operations, the lines 204 that serve as the power and ground interconnections are greater in number and/or size (e.g., measured as a diameter of each line) than the lines 204 that serve as the signal interconnections. See, for example, in FIG. 2 wherein it is shown that the lines 204 that serve as the power and ground interconnections are present in a greater number and each having a greater size than the lines 204 that serve as the signal interconnections. As will be described in detail below, Si interposer 200 can serve as an interposer structure in an integrated chip structure interconnecting one or more chips, one or more chip stacks or at least one chip in combination with at least one chip stack (via a substrate) to a printed wire board.

In general, the interposer structures presented and described herein can support active and/or passive functions. By way of example only, passive functions can include TSVs (as above) for vertical electrical connections, optical vias and waveguides, wiring for power, ground and signal connections (as above) and decoupling capacitors. Active functions can include complementary metal-oxide semiconductor (CMOS) function or other transistor active circuit and/or memory circuits.

Another advantage of the present teachings is that by employing comparatively fewer/smaller-sized TSVs and lines to serve as signal interconnections, i.e., as compared to power and ground interconnections, scaling can be more easily achieved than with conventional set-ups which typically use a same number of/same-sized conduits for power, ground and signal. Scalability is an important asset in meeting current technology demands. By way of example only, Si interposer 200 can be scaled to accommodate the latest technology node, e.g., 45 nanometer (nm) and 90 nm chip technology. As will be described in detail below, when multiple TSVs 202 serve as each power, ground and signal interconnection throughout the TSV plane, the multiple TSVs 202 that serve as each signal interconnection can have a pitch that is less than a pitch of the multiple TSVs 202 that serve as each power and ground interconnection. This configuration is shown illustrated in FIG. 2. A smaller pitch further contributes to the scalability of Si interposer 200. Further, with the variation in size and/or number of TSVs/lines that serve as power and ground interconnections, as compared to signal interconnections (as highlighted above), Si interposer 200 provides uniform power distribution to the chip(s) and/or chip stack(s) during low voltage operations which minimizes voltage droop across the chip(s) and/or chip stack(s) thus minimizing errors.

Figure 3A:
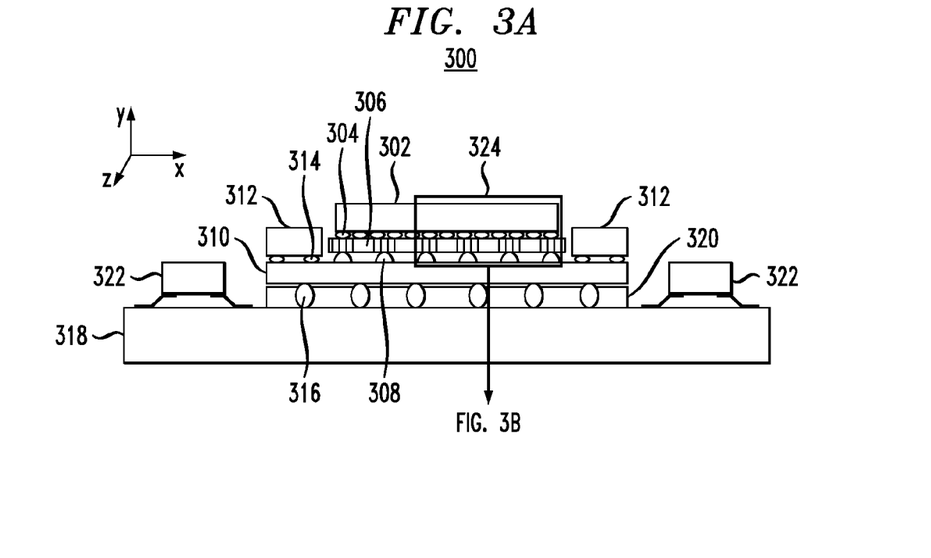
FIGS. 3A-B are cross-sectional diagrams illustrating an exemplary chip integration structure having a Si interposer that supports low voltage operations according to an embodiment of the present invention.

FIGS. 3A-B are cross-sectional diagrams illustrating exemplary chip integration structure 300 having a Si interposer, i.e., Si interposer 306, that supports low voltage operations. As will be described in detail below, the chip integration structures presented herein can be used to integrate a chip(s) and/or a chip stack(s) with a printed wire board. As shown in FIG. 3A, chip integration structure 300 includes chip 302 having one or more (i.e., power, ground and/or signal) connections 304 to Si interposer 306. Instead of a single chip 302, other chip configurations are possible, such as multiple chips (for example, arranged adjacent to one another as a single layer, arranged into one or more chip stacks (see, e.g., FIG. 4, described below) or arranged as a combination of at least one chip and at least one chip stack (see, e.g., FIG. 5, described below)). Si interposer 306 has one or more (i.e., power, ground and/or signal) connections 308 to substrate 310. Chip integration structure 300 can also include one or more decoupling capacitors, e.g., decoupling capacitors 312 having one or more (i.e., power and/or ground) connections 314 to substrate 310. Substrate 310 is, for example, a standard ceramic or organic substrate having one or more (i.e., power, ground and/or signal) connections 316 to printed wire board 318. Substrate 310 contains a plurality of lines therethrough (not shown) interconnecting connections 308 to Si interposer 306 and connections 316 to printed wire board 318. An organic or ceramic package, i.e., package 320, is shown between substrate 310 and printed wire board 318. The presence of package 320 is however optional and embodiments are anticipated herein where a package is not employed. As shown in FIG. 3A, certain other components may be bonded directly to printed wire board 318, such as dynamic random access memory (DRAM) devices 322 (e.g., which can also be based on a ceramic substrate).

Figure 3B:
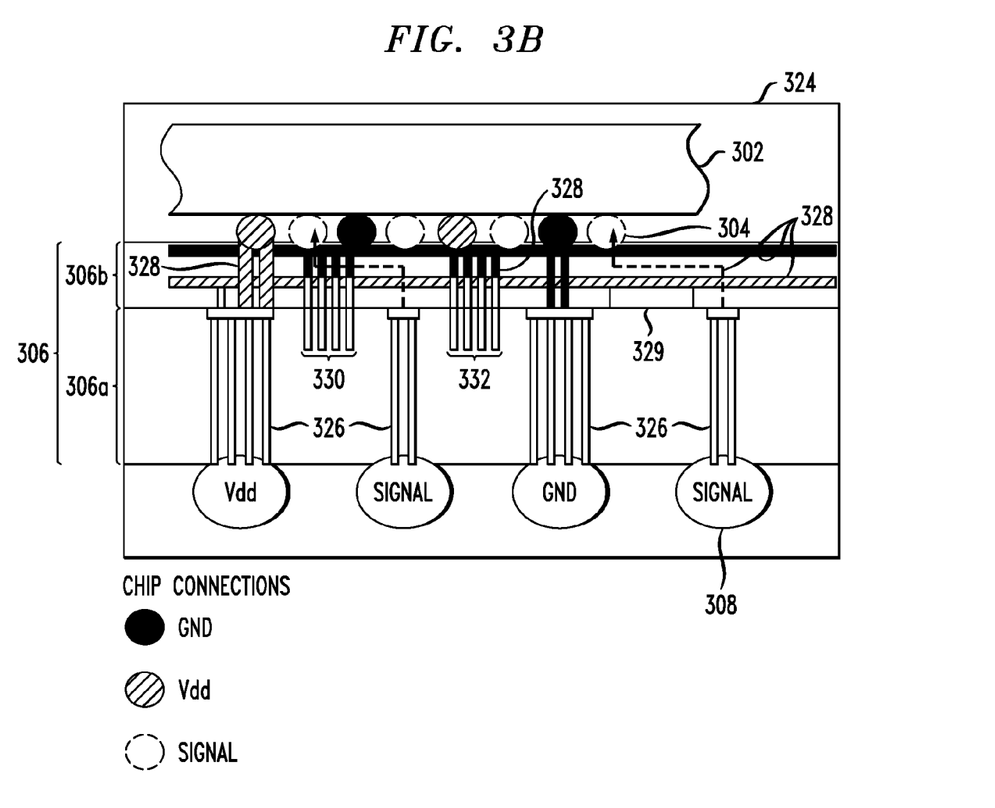

As with Si interposer 200, described in conjunction with the description of FIG. 2, above, Si interposer 306 is configured to support uniform power distribution, e.g., to chip 302, during low voltage operations. As shown in FIG. 3B, an exploded cross-sectional view of section 324 (of FIG. 3A), Si interposer 306 includes TSVs, i.e., TSVs 326, within a first plane thereof (TSV plane 306a). TSVs 326 serve as power (Vdd), ground (Gnd) and signal interconnections throughout the TSV plane 306a.

In order to support adequate current flow and uniform power delivery through Si interposer 306 during low voltage operations, the TSVs 326 that serve as the power and ground interconnections are greater in number and/or size (e.g., measured as a diameter of each TSV) than the TSVs 326 that serve as the signal interconnections. See, for example, in FIG. 3B wherein it is shown that the TSVs 326 that serve as the power and ground interconnections are present in a greater number than the TSVs 326 that serve as the signal interconnections. According to an exemplary embodiment, at least twice as many TSVs 326 are used as power and ground interconnections than as signal interconnections and/or each TSV 326 that serves as a power or a ground interconnection can have a size that is at least about 20 percent (%) larger than each TSV 326 that serves as a signal interconnection. A greater number and/or size of TSVs 326 that serve as power and ground interconnections can also serve to provide higher current flow as needed.

Si interposer 306 also includes lines 328 within a second plane thereof (power, ground and signal mesh plane 306b). Mesh plane 306b is adjacent to TSV plane 306a. Lines 328 are in contact with one or more of TSVs 326 in the TSV plane. Lines 328 serve as power, ground and signal interconnections throughout the mesh plane. For clarity, in mesh plane 306b, the lines 328 that serve as power interconnections are shown as hatched lines, the lines 328 that serve as ground interconnections are shown as solid black lines and the lines 328 that serve as signal interconnections are shown as dashed lines. The corresponding power, ground and signal connections 304 to chip 302 are similarly shown as hatched, solid and dashed circles, respectively.

In order to support uniform power distribution through Si interposer 306 during low voltage operations, the lines 328 that serve as the power and ground interconnections are greater in number and/or size (e.g., measured as a diameter of each line) than the lines 328 that serve as the signal interconnections. See, for example, in FIG. 3B wherein it is shown that the lines 328 that serve as the power and ground interconnections are present in a greater number and each have a greater size than the lines 328 that serve as the signal interconnections. According to an exemplary embodiment, at least twice as many lines 328 are used as power and ground interconnections than as signal interconnections and/or each line 328 that serves as a power or a ground interconnection can have a size that is at least about 20% larger than each line 328 that serves as a signal interconnection. A greater number and/or size of lines 328 that serve as power and ground interconnections can also serve to provide higher current as needed.

In addition to being able to support uniform power distribution during low voltage operations, Si interposer 306 is also configured to be scalable. As was highlighted above, it is common practice to separate power and ground connections, i.e., with at least one signal connection therebetween. As shown in FIG. 3B, power, ground and signal connections 304 to chip 302 and power, ground, signal connections 308 to substrate 310 are in such a staggered configuration. However, unlike conventional structures which typically use the same-sized conduits to feed power, ground and signal to the connections, Si interposer 306 has fewer and/or smaller sized TSVs/lines that serve as signal interconnections (as compared to power and ground interconnections). As such, Si interposer 306 can accommodate more aggressive scaling than conventional structures.

As shown in FIG. 3B, multiple TSVs 326 can serve as each power, ground and signal interconnection throughout the TSV plane. Further, the multiple TSVs 326 that serve as each signal interconnection can have a pitch that is less than a pitch of the multiple TSVs 326 that serve as each power and ground interconnection. The term "pitch," as used herein, refers to a distance between adjacent TSVs/lines or between adjacent connections. A smaller pitch further contributes to the scalability of Si interposer 306. For example, using smaller-sized TSVs/lines to serve as signal interconnections (as compared to power and ground interconnections) allows for the (signal) TSVs/lines to be placed closer together resulting in a smaller distance between those TSVs/lines, i.e., a smaller pitch.

Multiple (signal) TSVs 326 that are smaller in size and/or have a tighter pitch are possible in TSV plane 306a since transmission distances are typically short, for example, less than about five millimeters (mm), e.g., from about 0.5 mm to about five mm. In addition, the signal interconnections can have lower capacitance (for example, less than about one pico-Farad (pF), e.g., less than about 100 femto-Farad, e.g., less than about 10 femto-Farad) along with lower resistance values (for example, less than about 500 milliohms (mΩ), e.g., less than about 100 mΩ, e.g., less than about 10 mΩ) and lower inductance values (for example, less than about one nanohenry (nH), e.g., less than about 100 picohenry (pH)) which can be helpful for signal transmission at lower power levels. Further, by providing uniform power delivery to chip 302, the effects of voltage droop across chip 302 can be minimized. Care should also be taken where high densities of these interconnections are made at fine pitch spacing in X, Y and/or Z dimensions to provide shielding to minimize noise as needed.

A greater number of (power) TSVs/lines than is shown in FIG. 3B can be used, if needed, for voltage supplement. Voltage supplement can also be accomplished through the use of decoupling capacitors, such as decoupling capacitors 312, and/or one or more trench and/or parallel plate decoupling capacitors that can be integrated into Si interposer 306 (not shown). Integrated decoupling capacitors are shown illustrated, for example, in FIG. 6, described below. Similarly, a greater number of (ground) TSVs/lines than is shown in FIG. 3B can be used, if needed, to support a low inductance loop.

Si interposer 306 can further comprise one or more voltage regulator modules (VRMs) and/or voltage control modules (VCMs) (i.e., in the mesh plane in contact with one or more of the power and ground interconnections) each of which is represented schematically by module 329. VRMs and VCMs are both control circuits that can provide voltage regulation to a chip(s) to maintain operation within a narrow window of voltage swing to ensure proper function of circuits on the chip. Thus, VRMs and VCMs can be used to ensure that chip 302 receives the appropriate power. By way of example only, in multiple chip configurations (FIGS. 4 and 5, described below), different chips can have different power requirements and VRMs can be used to ensure that each chip receives the appropriate power. As will be described in detail below, the present Si interposers can be employed at various levels of a multiple chip stack configuration. VRMs can be incorporated into the Si interposers at each of the levels to ensure that proper power is being supplied. Further, the VRMs and VCMs can be a part of a voltage regulation and feedback supplement configuration. Namely, the VRMs and VCMs can be configured to monitor the voltage of circuits (i.e., within the chip) and adjust the voltage level higher or lower based on local dynamic voltage feedback.

Optionally, the (signal) TSVs/lines can be shielded. For example, as shown illustrated in FIG. 3B groupings 330 and 332 of (ground) TSVs can be placed on one or more sides of the (signal) TSVs to shield the signal from surrounding interference or noise.

Figure 4A:
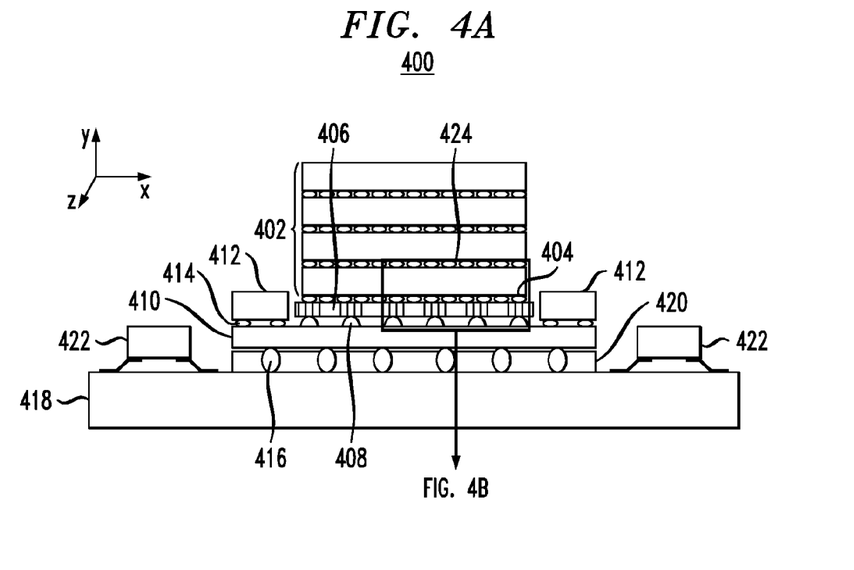
FIGS. 4A-B are cross-sectional diagrams illustrating another exemplary chip integration structure having a Si interposer that supports low voltage operations according to an embodiment of the present invention.

FIGS. 4A-B are cross-sectional diagrams illustrating exemplary chip integration structure 400 having a Si interposer, i.e., Si interposer 406, that supports low voltage operations. Chip integration structure 400 is the same as chip integration structure 300 (described, for example, in conjunction with the description of FIG. 3, above), except that chip integration structure 400 includes a chip stack instead of a single chip (configurations containing multiple chip stacks are also described herein (see, for example, FIG. 7, described below)). Namely, as shown in FIG. 4A, chip integration structure 400 includes chip stack 402 having one or more (i.e., power, ground and/or signal) connections 404 to Si interposer 406. Si interposer 406 has one or more (i.e., power, ground and/or signal) connections 408 to substrate 410. Chip integration structure 400 can also include one or more decoupling capacitors, e.g., decoupling capacitors 412 having one or more (i.e., power and/or ground) connections 414 to substrate 410. Substrate 410 is, for example, a standard ceramic or organic substrate having one or more (i.e., power, ground and/or signal) connections 416 to printed wire board 418. Substrate 410 contains a plurality of lines therethrough (not shown) interconnecting connections 408 to Si interposer 406 and connections 416 to printed wire board 418. An organic or ceramic package, i.e., package 420, is shown between substrate 410 and printed wire board 418. The presence of package 420 is however optional and embodiments are anticipated herein where a package is not employed. As shown in FIG. 4A, certain other components may be bonded directly to printed wire board 418, such as DRAM devices 422 (e.g., which can also be based on a ceramic substrate).

Figure 4B:
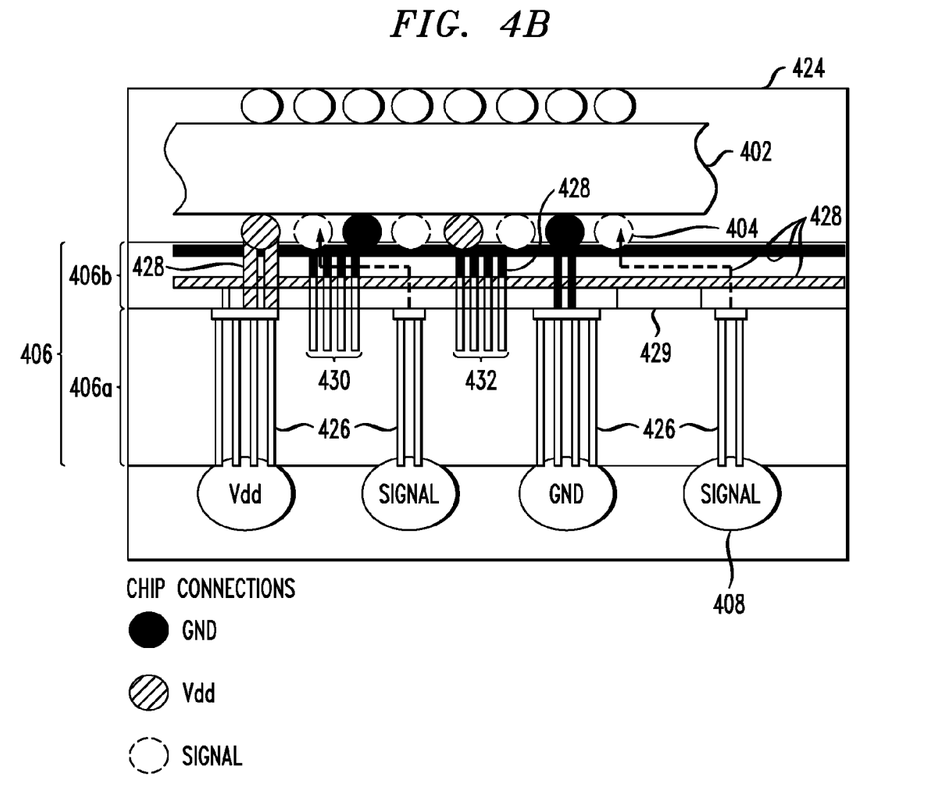

As with the Si interposers described above, Si interposer 406 is configured to support uniform power distribution, e.g., to chip stack 402, during low voltage operations and is configured to be scalable. As shown in FIG. 4B, an exploded cross-sectional view of section 424 (of FIG. 4A), Si interposer 406 includes TSVs, i.e., TSVs 426, within a first plane thereof (TSV plane 406a). TSVs 426 serve as power (Vdd), ground (Gnd) and signal interconnections throughout the TSV plane 406a.

In order to support uniform power distribution through Si interposer 406 during low voltage operations, the TSVs 426 that serve as the power and ground interconnections are greater in number and/or size (e.g., measured as a diameter of each TSV) than the TSVs 426 that serve as the signal interconnections. See, for example, in FIG. 4B wherein it is shown that the TSVs 426 that serve as the power and ground interconnections are present in a greater number than the TSVs 426 that serve as the signal interconnections. According to an exemplary embodiment, at least twice as many TSVs 426 are used as power and ground interconnections than as signal interconnections and/or each TSV 426 that serves as a power or a ground interconnection can have a size that is at least about 20% larger than each TSV 426 that serves as a signal interconnection. A greater number and/or size of TSVs 426 that serve as power and ground interconnections can also serve to provide higher current as needed.

Si interposer 406 also includes lines 428 within a second plane thereof (power, ground and signal mesh plane 406b). Mesh plane 406b is adjacent to TSV plane 406a. Lines 428 are in contact with one or more of TSVs 426 in the TSV plane. Lines 428 serve as power, ground and signal interconnections throughout the mesh plane. For clarity, in mesh plane 406b, the lines 428 that serve as power interconnections are shown as hatched lines, the lines 428 that serve as ground interconnections are shown as solid black lines and the lines 428 that serve as signal interconnections are shown as dashed lines. The corresponding power, ground and signal connections 404 to chip stack 402 are similarly shown as hatched, solid and dashed circles, respectively.

In order to support uniform power distribution through Si interposer 406 during low voltage operations, the lines 428 that serve as the power and ground interconnections are greater in number and/or size (e.g., measured as a diameter of each line) than the lines 428 that serve as the signal interconnections. See, for example, in FIG. 4B wherein it is shown that the lines 428 that serve as the power and ground interconnections are present in a greater number and each have a greater size than the lines 428 that serve as the signal interconnections. According to an exemplary embodiment, at least twice as many lines 428 are used as power and ground interconnections than as signal interconnections and/or each line 428 that serves as a power or a ground interconnection can have a size that is at least about 20% larger than each line 428 that serves as a signal interconnection. A greater number and/or size of lines 428 that serve as power and ground interconnections can also serve to provide higher current as needed.

As shown in FIG. 4B, groupings 430 and 432 of (ground) TSVs can optionally be placed on one or more sides of the (signal) TSVs to shield the signal interconnections from surrounding interference or noise. Si interposer 406 can further comprise one or more VRMs and/or VCMs, each of which is represented schematically by module 429, to provide voltage regulation to chip stack 402 to maintain operation within a narrow window of voltage swing to ensure proper function of circuits in the chip stack.

Design considerations for placing chips in a stacked configuration as compared to a single layer configuration, or vice versa, include providing the proper power, ground and/or signal interconnections in the proper orientations. A stacked configuration may also be referred to herein as a three-dimensional (3D) configuration and a single layer configuration may also be referred to herein as a two-dimensional (2D) configuration.

A stacked configuration can be used to increase the number of chips in a given area (density) leading to reduced transmission distances, i.e., smaller net lengths, and thus shorter latency periods, as compared to a device layout wherein all of the chips are assembled on the carrier interposer in a single layer configuration. The chips may be thinned to further increase density.

Figure 5A:
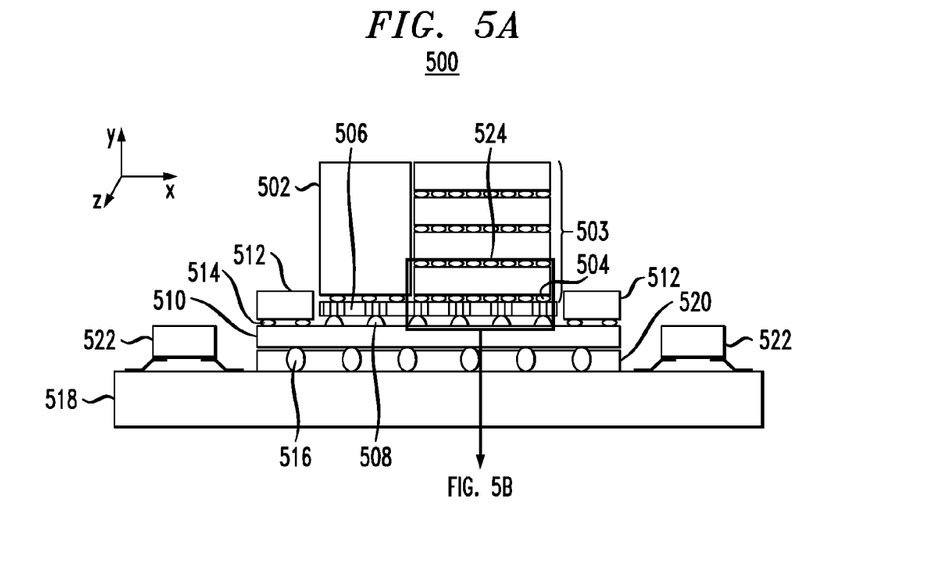
FIGS. 5A-B are cross-sectional diagrams illustrating yet another exemplary chip integration structure having a Si interposer that supports low voltage operations according to an embodiment of the present invention.

FIGS. 5A-B are cross-sectional diagrams illustrating exemplary chip integration structure 500 having a Si interposer, i.e., Si interposer 506, that supports low voltage operations. Chip integration structure 500 is the same as chip integration structure 300 and chip integration structure 400 (described, for example, in conjunction with the descriptions of FIGS. 3 and 4, above), except that chip integration structure 500 includes a chip in combination with a chip stack. Namely, as shown in FIG. 5A, chip integration structure 500 includes chip 502 and chip stack 503 having one or more (i.e., power, ground and/or signal) connections 504 to Si interposer 506. Si interposer 506 has one or more (i.e., power, ground and/or signal) connections 508 to substrate 510. Chip integration structure 500 can also include one or more decoupling capacitors, e.g., decoupling capacitors 512 having one or more (i.e., power and/or ground) connections 514 to substrate 510. Substrate 510 is, for example, a standard ceramic or organic substrate having one or more (i.e., power, ground and/or signal) connections 516 to printed wire board 518. Substrate 510 contains a plurality of lines therethrough (not shown) interconnecting connections 508 to Si interposer 506 and connections 516 to printed wire board 518. An organic or ceramic package, i.e., package 520, is shown between substrate 510 and printed wire board 518. The presence of package 520 is however optional and embodiments are anticipated herein where a package is not employed. As shown in FIG. 5A, certain other components may be bonded directly to printed wire board 518, such as DRAM devices 522 (e.g., which can also be based on a ceramic substrate).

As shown in FIG. 5A, the chips within chip stack 503 are thinner than chip 502. According to the present teachings, a number of processing steps can be performed on the chips before they are assembled on the carrier interposer. For example, the chips can be thinned. As highlighted above, thinning the chips increases density leading to reduced transmission distances. In one exemplary embodiment, each of the chips in chip stack 503 is configured to have a thickness of between about five micrometers ($\mu$m) and about 50 $\mu$m, and depending on the particular application, a tight tolerance of less than or equal to about ±two $\mu$m. Thus, according to this exemplary embodiment, a thickness of any chip that exceeds the maximum thickness can be reduced, e.g., via mechanical grinding and/or chemical mechanical polishing (CMP), to be within the specified thickness range. The chips can also be built from silicon-on-insulator (SOI) wafers that are within the specified thickness range.

Figure 5B:
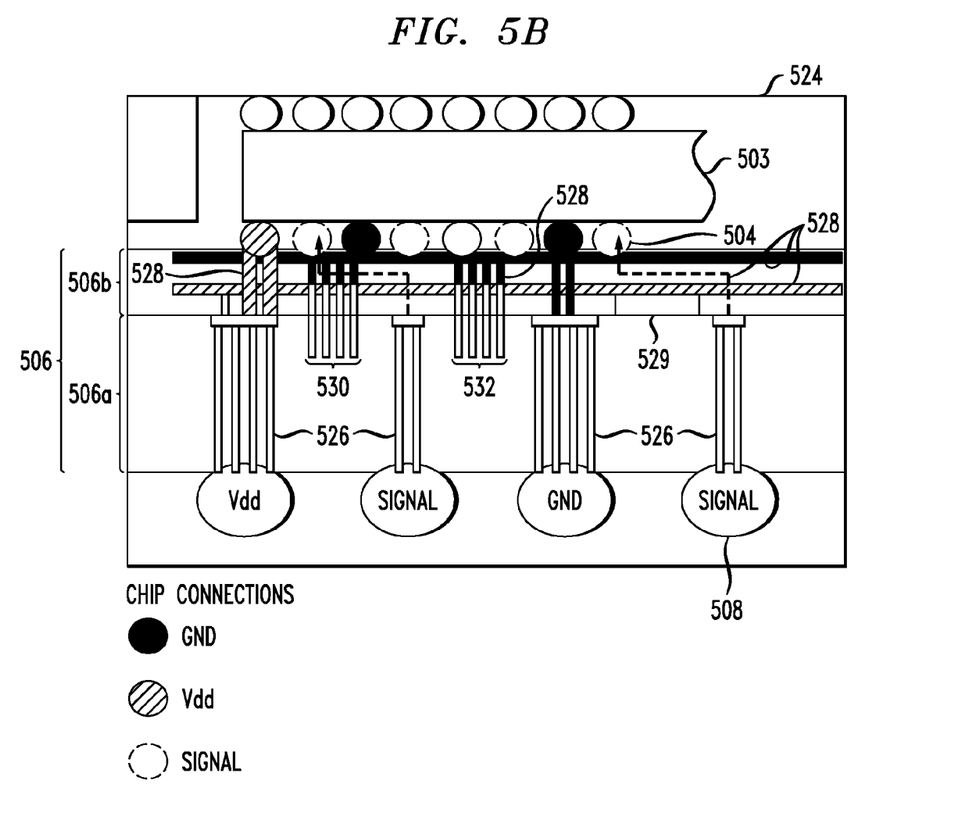

As with the Si interposers described above, Si interposer 506 is configured to support uniform power distribution, e.g., to chip 502/chip stack 503, during low voltage operations and is configured to be scalable. As shown in FIG. 5B, an exploded cross-sectional view of section 524 (of FIG. 5A), Si interposer 506 includes TSVs, i.e., TSVs 526, within a first plane thereof (TSV plane 506a). TSVs 526 serve as power (Vdd), ground (Gnd) and signal interconnections throughout the TSV plane 506a.

In order to support uniform power distribution through Si interposer 506 during low voltage operations, the TSVs 526 that serve as the power and ground interconnections are greater in number and/or size (e.g., measured as a diameter of each TSV) than the TSVs 526 that serve as the signal interconnections. See, for example, in FIG. 5B wherein it is shown that the TSVs 526 that serve as the power and ground interconnections are present in a greater number than the TSVs 526 that serve as the signal interconnections. According to an exemplary embodiment, at least twice as many TSVs 526 are used as power and ground interconnections than as signal interconnections and/or each TSV 526 that serves as a power or a ground interconnection can have a size that is at least about 20% larger than each TSV 526 that serves as a signal interconnection. A greater number and/or size of TSVs 526 that serve as power and ground interconnections can also serve to provide higher current as needed.

Si interposer 506 also includes lines 528 within a second plane thereof (power, ground and signal mesh plane 506b). Mesh plane 506b is adjacent to TSV plane 506a. Lines 528 are in contact with one or more of TSVs 526 in the TSV plane. Lines 528 serve as power, ground and signal interconnections throughout the mesh plane. For clarity, in mesh plane 506b, the lines 528 that serve as power interconnections are shown as hatched lines, the lines 528 that serve as ground interconnections are shown as solid black lines and the lines 528 that serve as signal interconnections are shown as dashed lines. The corresponding power, ground and signal connections 504 to chip stack 503 are similarly shown as hatched, solid and dashed circles, respectively.

In order to support uniform power distribution through Si interposer 506 during low voltage operations, the lines 528 that serve as the power and ground interconnections are greater in number and/or size (e.g., measured as a diameter of each line) than the lines 528 that serve as the signal interconnections. See, for example, in FIG. 5B wherein it is shown that the lines 528 that serve as the power and ground interconnections are present in a greater number and each have a greater size than the lines 528 that serve as the signal interconnections. According to an exemplary embodiment, at least twice as many lines 528 are used as power and ground interconnections than as signal interconnections and/or each line 528 that serves as a power or a ground interconnection can have a size that is at least about 20% larger than each line 528 that serves as a signal interconnection. A greater number and/or size of lines 528 that serve as power and ground interconnections can also serve to provide higher current as needed.

As shown in FIG. 5B, groupings 530 and 532 of (ground) TSVs can optionally be placed on one or more sides of the (signal) TSVs to shield the signal from surrounding interference or noise. Si interposer 506 can further comprise one or more VRMs and/or VCMs, each of which is represented schematically by module 529, to provide voltage regulation to chip 502/chip stack 503 to maintain operation within a narrow window of voltage swing to ensure proper function of circuits in the chip/chip stack.

Figure 6:
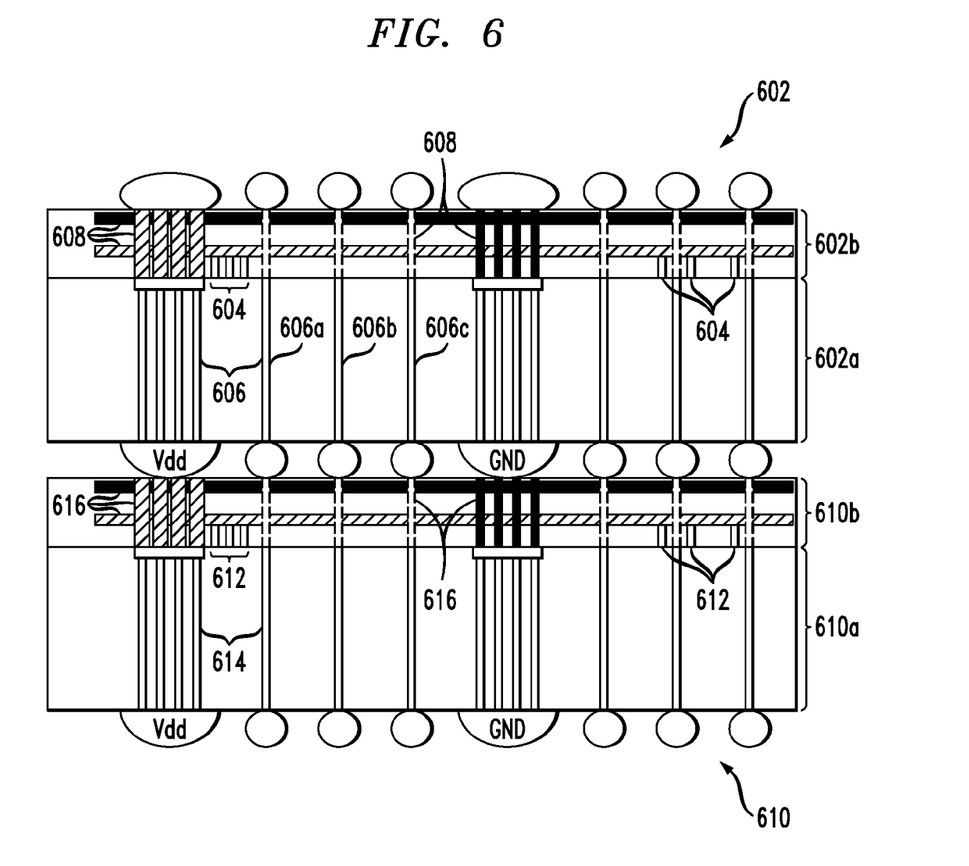
FIG. 6 is a cross-sectional diagram illustrating multiple Si interposers oriented in a stacked configuration according to an embodiment of the present invention.

FIG. 6 is a cross-sectional diagram illustrating a plurality of the present Si interposers oriented in a stacked configuration. As shown in FIG. 6, Si interposer 602 is stacked on top of Si interposer 610. As with the Si interposers described above, Si interposers 602/610 are configured to support uniform power distribution therethrough during low voltage operations and are configured to be scalable. Thus, Si interposers 602/610 each include power and ground interconnections in greater number and/or size than signal interconnections.

Namely, Si interposers 602/610 include TSVs, i.e., TSVs 606/614, within a first plane thereof (TSV plane 602a/610a, respectively) which serve as power (Vdd), ground (Gnd) and signal interconnections throughout the TSV planes. In order to support uniform power distribution through Si interposers 602/610 during low voltage operations, the TSVs that serve as the power and ground interconnections are greater in number and/or size (e.g., measured as a diameter of each TSV) than the TSVs that serve as the signal interconnections. According to an exemplary embodiment, at least twice as many of the TSVs are used as power and ground interconnections than as signal interconnections and/or each of the TSVs that serves as a power or a ground interconnection can have a size that is at least about 20% larger than each of the TSVs that serves as a signal interconnection. A greater number and/or size of the TSVs that serve as power and ground interconnections can also serve to provide higher current as needed.

Si interposers 602/610 also include lines 608/616 within a second plane thereof (power, ground and signal mesh planes 602b/610b which are adjacent to TSV planes 602a/610a, respectively). Lines 608/616 are in contact with one or more of TSVs 606/614, respectively, and serve as power, ground and signal interconnections throughout the mesh plane. For clarity, in mesh planes 602b/610b, the lines that serve as power interconnections are shown as hatched lines, the lines that serve as ground interconnections are shown as solid black lines and the lines that serve as signal interconnections are shown as dashed lines.

In order to support uniform power distribution through Si interposers 602/610 during low voltage operations, the lines that serve as the power and ground interconnections are greater in number and/or size (e.g., measured as a diameter of each line) than the lines that serve as the signal interconnections. According to an exemplary embodiment, at least twice as many lines are used as power and ground interconnections than as signal interconnections and/or each of the lines that serves as a power or a ground interconnection can have a size that is at least about 20% larger than each of the lines that serves as a signal interconnection. A greater number and/or size of the lines that serve as power and ground interconnections can also serve to provide higher current as needed.

A plurality of, i.e., trench and/or parallel plate, decoupling capacitors 604/612 are also shown in mesh planes 602b/610b, respectively. As highlighted above, integrated decoupling capacitors can be used for voltage supplement.

Using the present Si interposers in a stacked configuration can be done for a number of reasons. By way of example only, stacked Si interposers provide a shorter distance for signals to travel between chips and thus permit wide bandwidth, low latency and low power to be used to drive signals between circuits. In particular, the present Si interposers may be stacked on one another (as shown illustrated in FIG. 6) in order to get higher cross sectional bandwidth and/or increased circuit density in close proximity or across two separate Si interposers so as to provide a low cost means of high bandwidth connections, rather than resorting to lower density and lower performance alternative interconnections (for example, in applications needing high bandwidth where ceramic, organic or thin film interconnection capability is too limited or too expensive).

Si interposers 602 and 610 are each configured with power (Vdd) and ground (Gnd) interconnections separated by one or more signal interconnections. According to one exemplary embodiment, each of the interconnections between the power and ground interconnections are signal interconnections. Alternatively, according to another exemplary embodiment, some of the interconnections between the power and ground interconnections are signal interconnections while others are shielding TSVs/lines. For example, by way of reference to Si interposer 602, each of TSVs 606a, 606b and 606c can serve as signal interconnections, or alternatively, TSV 606b can serve as a signal interconnection while TSVs 606a and 606c serve as shielding TSVs.

While Si interposers 602 and 610 are shown to have the same configuration as each other, this is not required. By way of example only, the interconnections in mesh plane 602b of Si interposer 602 could be configured differently from those in Si interposer 610, e.g., to the specifications of a chip(s) and/or a chip stack(s) bound thereto.

Figure 7:
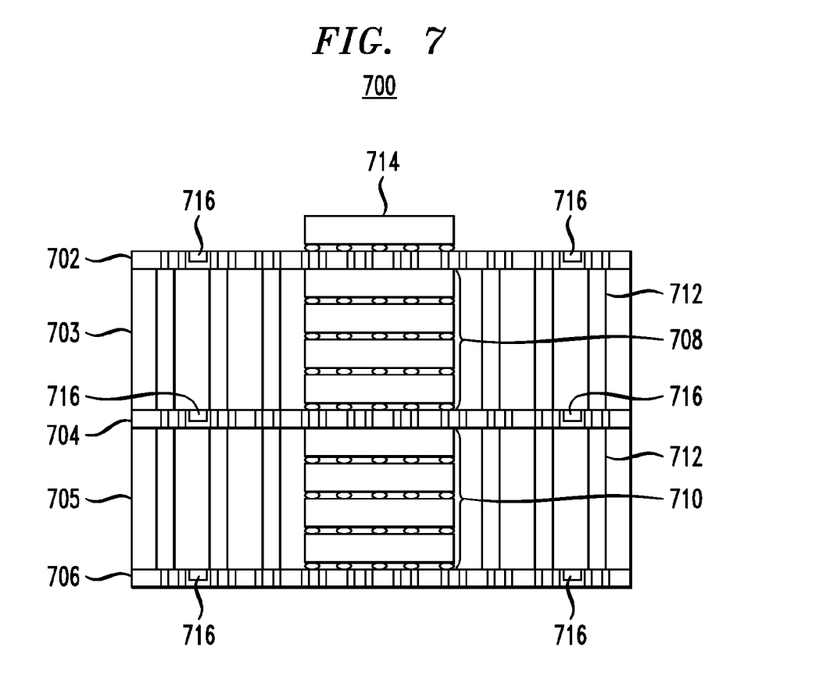
FIG. 7 is a cross-sectional diagram illustrating an exemplary chip assembly wherein Si interposers are used to integrate multiple chip stacks according to an embodiment of the present invention.

FIG. 7 is a cross-sectional diagram illustrating exemplary chip assembly 700 wherein Si interposers 702, 704 and 706 are being used to integrate multiple chip stacks 708 and 710. According to an exemplary embodiment, chip stacks 708 and 710 comprise 3D memory chip stacks. Si layer 703 is present between Si interposers 702 and 704 and surrounds chip stack 708. Si layer 705 is present between Si interposers 704 and 706 and surrounds chip stack 710.

Si interposers 702, 704 and 706 are representative of any one of the Si interposers described in conjunction with the description of FIGS. 2, 3A-B, 4A-B, 5A-B and 6, above, and thus each contains a power and ground mesh plane and a TSV plane wherein power and ground interconnections therein are present in a greater number and/or have a greater size than signal interconnections therein. Further, the assembly shown in FIG. 7 can be incorporated into any of the chip integration structures shown in FIGS. 3A-B, 4A-B and 5A-B. By way of example only, assembly 700 can be used in place of, or in addition to, chip 302/Si interposer 306 in chip integration structure 300 of FIGS. 3A-B, described above.

Assembly 700 uses the present Si interposer configurations in combination with via farms. Namely, power and ground (and possibly signal) interconnections are provided through Si layers 703 and 705 by TSVs 712 that surround chip stacks 708 and 710 (it is to be understood that FIG. 7 represents a cross-sectional view and that TSVs 712 may also be present in front of and/or behind chip stacks 708 and 710). For example, it may not be possible to pass large TSVs through the chip stacks, therefore (as shown in FIG. 7) the TSVs can be oriented in "farms" surrounding the chip stack.

Si interposers 702, 704 and 706 provide the necessary power and ground (and possibly signal) interconnections between TSVs 712 and chip stacks 708/710, at the proper pitch(es). Further, Si interposers 702, 704 and 706 in combination with TSVs 712 provide uniform power to chip stacks 708/710, thereby minimizing voltage droop. As such, low voltage, low power operations are supported. As highlighted above, Si interposer 702, Si interposer 704 and/or Si interposer 706 can comprise one or more VRMs and/or VCMs each of which is represented schematically by module 716.

Figure 8:
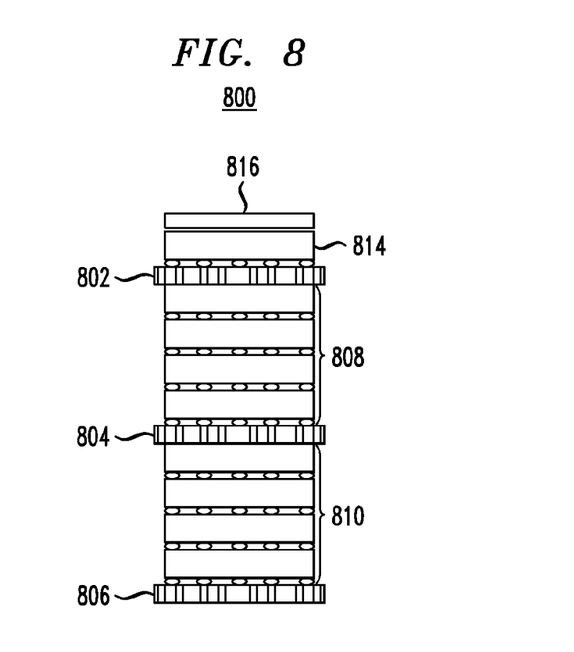
FIG. 8 is a cross-sectional diagram illustrating another exemplary chip assembly wherein Si interposers are used to integrate multiple chip stacks according to an embodiment of the present invention.

Chip 714 is connected to Si interposer 702 opposite chip stack 708. According to an exemplary embodiment, chip 714 is a processor chip. Another advantage of the exemplary embodiment shown illustrated in FIG. 7 is that TSVs 712 serve to efficiently and effectively transport heat vertically, e.g., up from the various levels of assembly 700 to a heat spreader or cooler located above chip 714 (not shown). A chip assembly having a cooling unit, such as a heat spreader or cooler, is shown in FIG. 8, described below.

It is not always necessary to have TSV farms surrounding the chip stacks, as long as connections through the chip are suitable to support uniform power delivery. See, for example, FIG. 8. FIG. 8 is a cross-sectional diagram illustrating exemplary chip assembly 800 wherein Si interposers 802, 804 and 806 are used to integrate multiple chip stacks 808 and 810. According to an exemplary embodiment, chip stacks 808 and 810 comprise 3D memory chip stacks. Si interposers 802, 804 and 806 are representative of any one of the Si interposers described in conjunction with the description of FIGS. 2, 3A-B, 4A-B, 5A-B and 6, above, and thus each contains a power and ground mesh plane and a TSV plane wherein power and ground interconnections therein are present in a greater number and/or have a greater size than signal interconnections therein. Further, the assembly shown in FIG. 8 can be incorporated into any of the chip integration structures shown in FIGS. 3A-B, 4A-B and 5A-B. By way of example only, assembly 800 can be used in place of, or in addition to, chip 302/Si interposer 306 in chip integration structure 300 of FIG. 3, described above.

Si interposers 802, 804 and 806 provide the necessary power, ground and signal connections to chip stacks 808 and 810, at the proper pitch(es). Further, Si interposers 802, 804 and 806 provide uniform power to chip stacks 808 and 810, thereby minimizing voltage droop. As such, low voltage, low power operations are supported. As highlighted above, Si interposer 802, Si interposer 804 and/or Si interposer 806 can comprise integrated decoupling capacitors and one or more VRMs and/or VCMs (not shown).

Chip 814 is connected to Si interposer 802 (the topmost Si interposer in the assembly) opposite chip stack 808. According to an exemplary embodiment, chip 814 is a processor chip. At least one cooling unit is in contact with one of the Si interposers or chip/chip stacks. By way of example only, cooling unit 816 is present over chip 814. As described above, heat can be transported vertically up through the assembly to a cooling unit, i.e., cooling unit 816. Cooling unit 816 can be a heat spreader (e.g., a copper or aluminum heat spreader) or a cooler (e.g., a heat pipe, cooling fin or cooling assembly) that serves to take heat away from the assembly. According to an exemplary embodiment, heat is transferred through the chip/chip stacks and through a thermal interface material (TIM) (not shown), such as solder TIM or gel TIM between chip 814 and cooling unit 816, and into cooling unit 816. Thus, when chip 814 is a processor chip and chip stacks 808 and 810 are memory chip stacks, it is advantageous to locate chip 814 above chip stacks 808 and 810 to place chip 814 closer to the cooling unit, as processors generally require more power and hence more cooling than memory chips.

In processing, handling, assembly and testing of structures, it is important to have appropriate interconnections. For vertical buses, or combinations of vertical and horizontal interconnections, it may be desirable to put buffer or "booster" circuits in a line as means to ensure signal integrity from transmitter to receiver. The general structure and function of buffer circuits are well known to those skilled in the art and thus are not described further herein. In the case of an assembly, it may be advantageous to put these circuits in a layer for purposes of minimizing costs, number of processing steps, cross-section of multiple layers and/or or Si strata levels. Thus, according to an exemplary embodiment, one or more buffer circuits (not shown) are integrated into at least one of Si interposers 802, 804 and 806.

It is also important to control electrostatic discharge (ESD) to minimize power on circuits between connections and between different levels of the assembly, and also from the assembly to off-chip(s)/chip stack(s) through I/O (input-output) connections. According to an exemplary embodiment, one or more protective ESD devices (not shown) are integrated into at least one of Si interposers 802, 804 and 806. The general structure and function of protective ESD devices are well known to those skilled in the art and thus are not described further herein. However, conventional specifications and standards for ESD are often at about a 1,000 volt (V) protection level which drives more circuits and more power but is undesirable if one is trying to minimize power consumption and increase bandwidth and interconnections. Therefore, with the present teachings, circuits can be designed which can have scaled ESD protection (for example, less than about 500 V, e.g., less than about 100 V, e.g., less than about 10 V) and reduced circuit size and power consumption by the protective devices. The level of ESD protection can be defined to be consistent with any testing to which the structure might be subjected and protective means during processing, handling and assembly. Further, various different levels of ESD protection can be incorporated into a common assembly so as to have one or more levels of voltage protection, e.g., to accommodate future voltage level and/or power demand changes.

Additionally, one or more control chips and/or memory interface chips (MICs) (not shown) can be incorporated into at least one of Si interposers 802, 804 and 806 to coordinate and interact with, e.g., memory, chip stacks 808 and 810. The general structure and function of control chips and MICs are well known to those skilled in the art and thus are not described further herein. The control chip(s) and/or MIC(s) employed should take into account proper connection designations, bandwidth and ESD, as well as the overall architecture of the particular assembly into which they are incorporated.

Figure 9A:
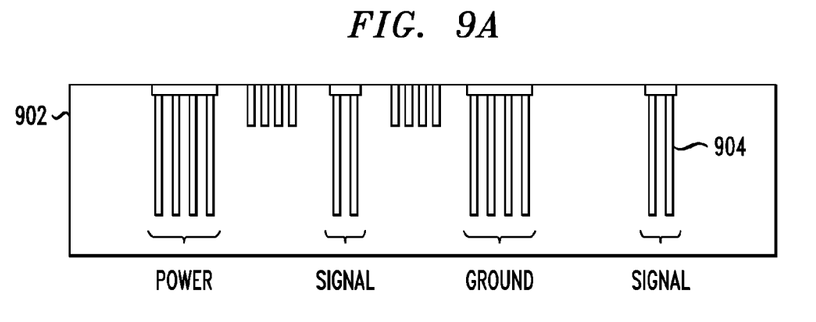
FIGS. 9A-C are cross-sectional diagrams illustrating an exemplary methodology for fabricating a Si interposer that supports uniform power distribution during low voltage operations according to an embodiment of the present invention.
Figure 9B:
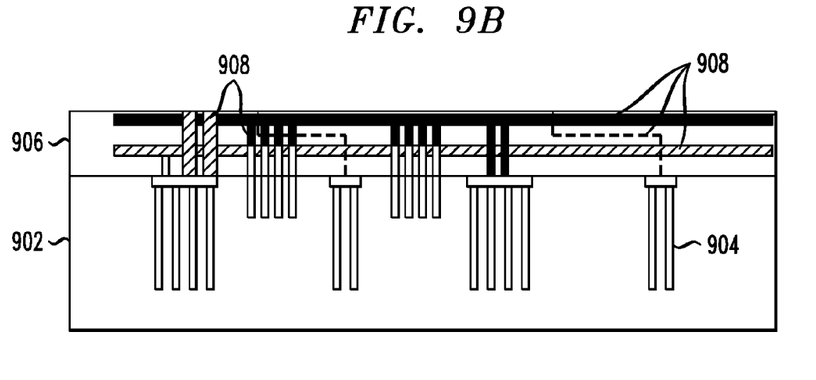
Figure 9C:
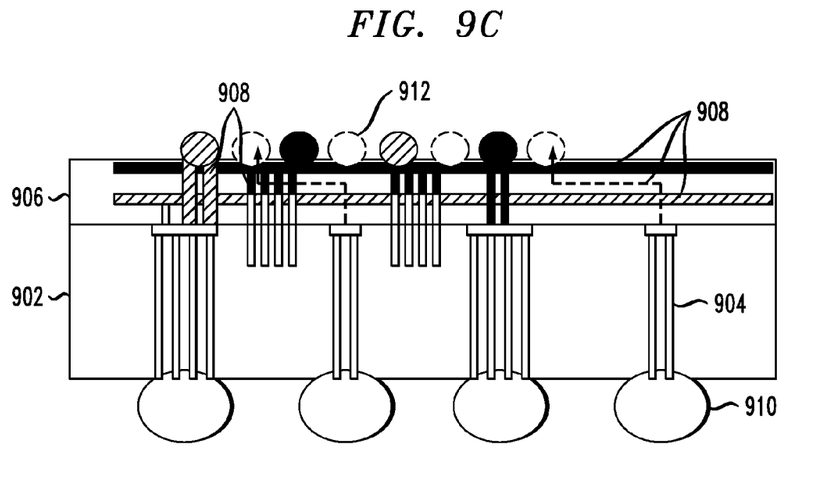

FIGS. 9A-C are cross-sectional diagrams illustrating an exemplary methodology for fabricating a Si interposer that supports uniform power distribution during low voltage operations. The methodology illustrated in FIGS. 9A-C can be used to fabricate any of the Si interposers described above. As shown in FIG. 9A, a Si wafer 902 is provided. According to an exemplary embodiment, Si wafer 902 comprises a bulk Si wafer. TSVs 904 are then formed in Si wafer 902. By forming TSVs 904 in Si wafer 902 a first plane of the interposer is created. As highlighted above, this plane may also be referred to as a TSV plane. The TSVs 904 formed in Si wafer 902 are adapted to serve as power, ground and signal interconnections throughout the TSV plane and are formed such that the TSVs that serve as the power and ground interconnections are greater in at least one of number and size than the TSVs that serve as the signal interconnections. See, for example, FIG. 9A wherein it is shown that a greater number of TSVs have been formed as power and ground interconnections than as signal interconnections. TSVs 904 can be formed in a number of different ways. An exemplary methodology for forming TSVs 904 is shown illustrated in FIGS. 10A-C, described below.

As shown in FIG. 9B, an insulator layer, i.e., insulator layer 906, is deposited over Si wafer 902. According to an exemplary embodiment, insulator layer 906 comprises an oxide material, such as silicon dioxide ($SiO_2$). Lines 908 are then formed in insulator layer 906. Lines 908 are in contact with one or more of TSVs 904 in Si wafer 902. By forming lines 908 in insulator layer 906 a second plane of the interposer is created adjacent to the first plane. As highlighted above, this plane may also be referred to as a power, ground and signal mesh plane. The lines 908 formed in insulator layer 906 are adapted to serve as power, ground and signal interconnections throughout the mesh plane and are formed such that the lines that serve as the power and the ground interconnections are greater in at least one of number and size than the lines that serve as signal interconnections. See, for example, FIG. 9B wherein it is shown that a greater number of lines have been formed as power and ground interconnections than as signal interconnections.

For clarity, the lines 908 that serve as power interconnections are shown as hatched lines, the lines 908 that serve as ground interconnections are shown as solid black lines and the lines 908 that serve as signal interconnections are shown as dashed lines. Lines 908 can be formed using any conventional back-end-of-line (BEOL) process. According to an exemplary embodiment, a BEOL metal line forming technique, such as dual damascene processing, is used to form lines 908 in insulator layer 906.

As shown in FIG. 9C, a side of Si wafer 902 opposite insulator layer 906 is planed, e.g., using CMP, so as to expose one or more of TSVs 904. Connections 910 and 912 are then formed in contact with TSVs 904 and lines 908, respectively. According to an exemplary embodiment, connections 910 and 912 both comprise solder bumps.

Figure 10A:
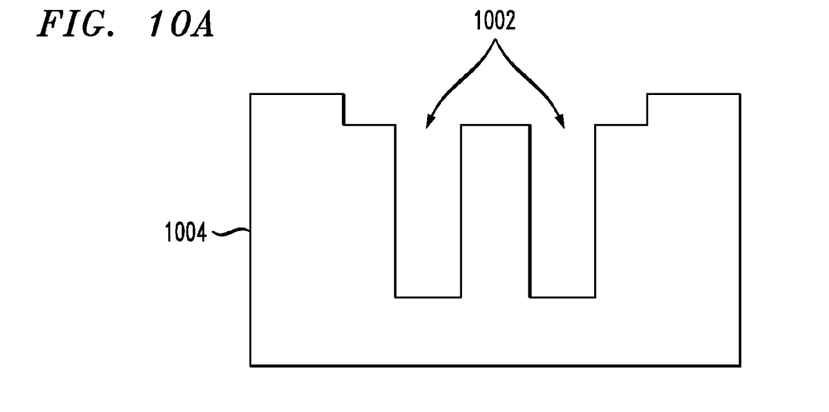
FIGS. 10A-C are cross-sectional diagrams illustrating an exemplary methodology for fabricating through-silicon vias (TSVs) according to an embodiment of the present invention.
Figure 10B:
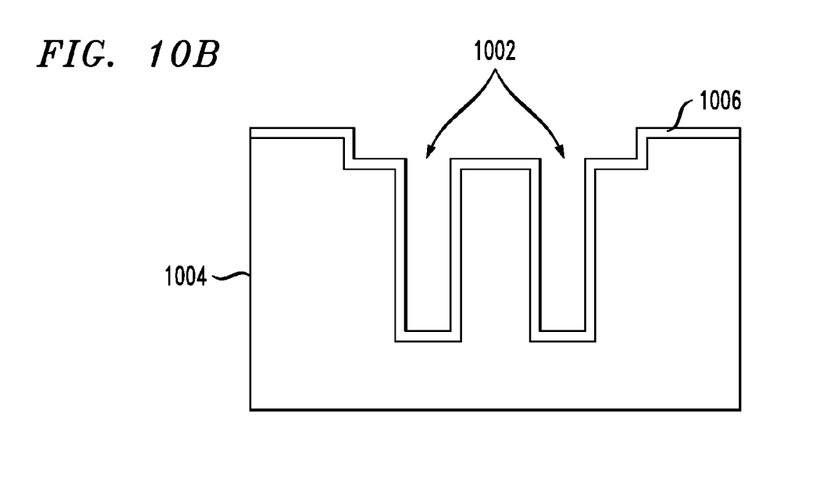
Figure 10C:
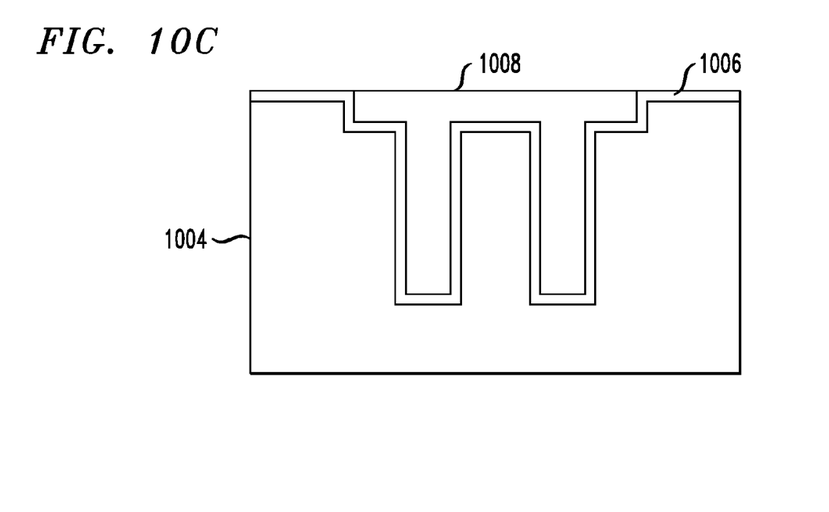

FIGS. 10A-C are cross-sectional diagrams illustrating an exemplary methodology for fabricating TSVs, e.g., TSVs 904 described in conjunction with the description of FIGS. 9A-C, above. As shown in FIG. 10A, holes 1002 are etched into an Si wafer 1004, each hole 1002 corresponding to one of the TSVs. According to an exemplary embodiment, holes 1002 are etched into Si wafer 1004 using deep Si reactive ion etching (RIE).

As shown in FIG. 10B, an insulation layer 1006 is then deposited on a bottom and sides of each of holes 1002 (and potentially over an exposed top surface of Si wafer 1004). According to an exemplary embodiment, insulation layer 1006 comprises an oxide or nitride material. As shown in FIG. 10C, holes 1002 are filled with a metal(s) 1008 to form TSVs. According to an exemplary embodiment, a combined seed/barrier layer, such as a tantalum (Ta)/tantalum nitride (TaN) or titanium (Ti)/titanium nitride (TiN), is first deposited over insulation layer 1006. A conductor, such as chemical vapor deposition (CVD) deposited tungsten (W) or plated copper (Cu), is then used to fill holes 1002 to form the TSVs.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A silicon interposer, comprising:
   a plurality of through-silicon vias within a first plane of the interposer, wherein the through-silicon vias are adapted to serve as power, ground and signal interconnections throughout the first plane such that the through-silicon vias that serve as the power and ground interconnections are greater in at least one of number and size than the through-silicon vias that serve as the signal interconnections so as to support uniform power distribution during low voltage operations; and
   a plurality of lines within a second plane of the interposer in contact with one or more of the through-silicon vias in the first plane, the second plane being adjacent to the first plane, wherein the lines are adapted to serve as power, ground and signal interconnections throughout the second plane such that the lines that serve as the power and ground interconnections are greater in at least one of number and size than the lines that serve as the signal interconnections so as to support uniform power distribution during low voltage operations.

2. The silicon interposer of claim 1, wherein the through-silicon vias and lines that serve as the power and ground interconnections are present in number and size to support uniform power distribution during low voltage operations of less than 500 millivolts.

3. The silicon interposer of claim 1, wherein the through-silicon vias and lines that serve as the power and ground interconnections are present in number and size to support uniform power distribution during low voltage operations of less than 300 millivolts.

4. The silicon interposer of claim 1, wherein multiple through-silicon vias serve as each power, ground and signal interconnection throughout the first plane.

5. The silicon interposer of claim 4, wherein the multiple through-silicon vias that serve as each signal interconnection throughout the first plane have a pitch that is less than a pitch of the multiple through-silicon vias that serve as each power and ground interconnection throughout the first plane.

6. The silicon interposer of claim 1, further comprising at least one voltage regulator module and at least one voltage control module within the second plane of the interposer in contact with one or more of the lines that serve as power and ground interconnections throughout the second plane, wherein the at least one voltage regulator module and the at least one voltage control module are adapted to regulate voltage level through the one or more lines that serve as power and ground interconnections so as to support uniform power distribution during low voltage operations.

7. A chip integration structure comprising:
   a substrate;
   at least one silicon interposer with one or more power, ground and signal connections to the substrate, the silicon interposer comprising:
      a plurality of through-silicon vias within a first plane of the interposer in contact with the one or more power, ground and signal connections to the substrate, wherein the through-silicon vias are adapted to serve as power, ground and signal interconnections throughout the first plane such that the through-silicon vias that serve as the power and ground interconnections are greater in at least one of number and size than the through-silicon vias that serve as the signal interconnections so as to support uniform power distribution during low voltage operations;
      a plurality of lines within a second plane of the interposer in contact with one or more of the through-silicon vias in the first plane, the second plane being adjacent to the first plane, wherein the lines are adapted to serve as power, ground and signal interconnections throughout the second plane such that the lines that serve as the power and ground interconnections are greater in at least one of number and size than the lines that serve as the signal interconnections so as to support uniform power distribution during low voltage operations; and
   one or more chips, one or more chip stacks or at least one chip in combination with at least one chip stack having one or more power, ground and signal connections to the silicon interposer that are in contact with one or more of the lines within the second plane of the interposer.

8. The chip integration structure of claim 7, further comprising:
   a printed wire board having one or more power, ground and signal connections to the substrate.

9. The chip integration structure of claim 7, further comprising:
   at least one decoupling capacitor having one or more power and ground connections to the substrate.

10. The chip integration structure of claim 8, further comprising:
    a package having one or more power, ground and signal connections to both the substrate and the printed wire board.

11. The chip integration structure of claim 7, comprising a plurality of the silicon interposers, at least two of which are in a stacked configuration with one another.

12. The chip integration structure of claim 7, comprising a plurality of the silicon interposers and a plurality of the chip stacks, wherein each of the chip stacks is located between two of the silicon interposers.

13. The chip integration structure of claim 7, comprising a plurality of the silicon interposers and a plurality of the chip stacks, wherein each of the chip stacks is located between two of the silicon interposers, the chip integration structure further comprising:
    at least one silicon layer between each of the silicon interposers; and
    one or more through-silicon vias that extend through each silicon layer.

14. The chip integration structure of claim 13, wherein the through-silicon vias that extend through each of the silicon layers comprise through-silicon via farms surrounding the chip stacks.

15. The chip integration structure of claim 7, comprising at least one chip stack, wherein each chip adjacent to another chip in the stack has power, ground and signal connections to the adjacent chip.

16. The chip integration structure of claim 7, comprising a plurality of the silicon interposers and a plurality of the chip stacks, wherein each of the chip stacks is located between two of the silicon interposers, and wherein one or more of the chip stacks comprise memory chip stacks.

17. The chip integration structure of claim 7, comprising a plurality of the silicon interposers and a plurality of the chip stacks, wherein each of the chip stacks is located between two of the silicon interposers, the chip integration structure further comprising:
    at least one processor chip connected to a topmost one of the silicon interposers.

18. The chip integration structure of claim 17, further comprising:
    at least one cooling unit in contact with one of the silicon interposers, the processor chip or one of the chip stacks.

19. The chip integration structure of claim 18, wherein the cooling unit is a heat spreader, a cooler, a heat pipe, a cooling fin or a cooling assembly.

20. A method of fabricating silicon interposer that supports uniform power distribution during low voltage operations, the method comprising the steps of:
    providing a silicon wafer;
    creating a first plane of the interposer by forming a plurality of through-silicon vias in the wafer, wherein the through-silicon vias are adapted to serve as power, ground and signal interconnections throughout the first plane and are formed such that the through-silicon vias that serve as the power and ground interconnections are greater in at least one of number and size than the through-silicon vias that serve as the signal interconnections so as to support uniform power distribution during low voltage operations;
    depositing an insulator layer over the silicon wafer; and
    creating a second plane of the interposer adjacent to the first plane by forming a plurality of lines within the insulator layer in contact with one or more of the through-silicon vias in the wafer, wherein one or more of the lines are adapted to serve as power, ground and signal interconnections throughout the second plane and are formed such that the lines that serve as the power and ground interconnections are greater in at least one of number and size than the lines that serve as the signal interconnections so as to support uniform power distribution during low voltage operations.

21. The method of claim 20, further comprising the step of:
    planing a side of the wafer opposite the insulator layer so as to expose one or more of the through-silicon vias.

22. The method of claim 20, further comprising the steps of:
    etching a plurality of holes in the wafer, each hole corresponding to one of the through-silicon vias;
    depositing an insulation material on a bottom and sides of each of the holes; and
    filling the holes with at least one metal to form the through-silicon vias.

* * * * *